United States Patent
Tomishima (10) Patent No.: US 12,191,135 B2
(45) Date of Patent: Jan. 7, 2025

(54) TWO TRANSISTOR GAIN CELL MEMORY WITH INDIUM GALLIUM ZINC OXIDE

(71) Applicant: Intel Corporation, Santa Clara, CA (US)

(72) Inventor: Shigeki Tomishima, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 866 days.

(21) Appl. No.: 17/132,908

(22) Filed: Dec. 23, 2020

(65) Prior Publication Data

US 2021/0151437 A1    May 20, 2021

(51) Int. Cl.
| | |
|---|---|
| *H01L 21/02* | (2006.01) |
| *H01L 21/4763* | (2006.01) |
| *H01L 27/12* | (2006.01) |
| *H01L 29/24* | (2006.01) |
| *H01L 29/66* | (2006.01) |
| *H01L 29/786* | (2006.01) |

(52) U.S. Cl.
CPC .... *H01L 27/1225* (2013.01); *H01L 21/02565* (2013.01); *H01L 21/02592* (2013.01); *H01L 21/02631* (2013.01); *H01L 21/47635* (2013.01); *H01L 27/124* (2013.01); *H01L 27/127* (2013.01); *H01L 29/247* (2013.01); *H01L 29/66969* (2013.01); *H01L 29/78693* (2013.01)

(58) Field of Classification Search
CPC .............. H10B 99/00; H01L 21/02565; H01L 21/02592; H01L 21/02631; H01L 21/47635; H01L 27/1225; H01L 27/124; H01L 27/127; H01L 29/247; H01L 29/66969; H01L 29/78693
USPC ........................................................... 257/43
See application file for complete search history.

(56) References Cited

U.S. PATENT DOCUMENTS

| | | |
|---|---|---|
| 7,120,072 B2 | 10/2006 | Ye et al. |
| 7,123,500 B2 | 10/2006 | Ye et al. |
| 10,847,656 B2 | 11/2020 | Le et al. |
| 2018/0366587 A1 | 12/2018 | Le et al. |
| 2020/0052099 A1 | 2/2020 | Yamazaki et al. |

(Continued)

FOREIGN PATENT DOCUMENTS

| | | | |
|---|---|---|---|
| CN | 117241575 A | * 12/2023 | |
| EP | 3674991 A1 | * 7/2020 | ........... G06F 7/5443 |

(Continued)

OTHER PUBLICATIONS

Belmonte A et al: "Capacitor-less, Long-Retention (400s) DRAM Cell Paving the Way towards Low-Power and High-Density Monolithic 3D DRAM", 2020 IEEE International Electron Devices Meeting (IEDM), IEEE, Dec. 12, 2020 (Dec. 12, 2020), XP033885469.

(Continued)

*Primary Examiner* — Phuc T Dang
(74) *Attorney, Agent, or Firm* — Compass IP Law PC (57) ABSTRACT

An example two transistor (2T) gain cell memory with indium-gallium-zinc-oxide (IGZO) transistors. Examples include IGZO transistors included in a dynamic random access memory (DRAM) cell. The IGZO transistors included in the DRAM cell are described as being formed or created in a back end (BE) metal process stack of an integrated circuit chip or die.

8 Claims, 10 Drawing Sheets

Cell 400

(56) References Cited

U.S. PATENT DOCUMENTS

2020/0266107 A1    8/2020  Yamazaki et al.
2022/0067501 A1 *  3/2022  Horng ..................... G06N 3/08

FOREIGN PATENT DOCUMENTS

WO    WO-2017111798 A1 *  6/2017  ........... G11C 11/404
WO    WO-2019005094 A1 *  1/2019

OTHER PUBLICATIONS

Extended European Search Report for Patent Application No. 21198680.7, Mailed Mar. 23, 2022, 11 pages.
Somasekhar D et al; "2GHZ Mb 2T Gain Cell Memory Macro With 128 GBytes/sec Bandwidth in a 65 nm Logic Process Technology"; IEEE Journal of Solid-State Circuits, vol. 44, No. 1; Jan. 2009; 12 pages.

* cited by examiner

Cell 400

TWO TRANSISTOR GAIN CELL MEMORY WITH INDIUM GALLIUM ZINC OXIDE

TECHNICAL FIELD

Examples described herein are generally related to two transistor (2T) gain dynamic random access (DRAM) memory cell with indium gallium zinc oxide (IGZO).

BACKGROUND

High density memories are becoming an increasingly important piece of a large level-4/last-level cache (L4/LLC) memory between a processor and main or system memory. An ability to fabricate dense memories with a low impact on a semiconductor process to manufacture processors and associated L4/LLC memories are of great interest. Multi-core processors have magnified the need to provide adequate memory bandwidth, e.g., higher density and closer proximity to cores of these multi-core processors. Types of memories intended for integration on a same die as a processor include static random access memory (SRAM) that may add little to no process costs to one transistor, one capacitor (1T-1C) embedded dynamic random access memory (eDRAM) that do add process costs but may have a higher bit density (e.g., smaller memory cell dimensions).

DETAILED DESCRIPTION

In some examples, as mentioned above, 1T-1C eDRAM may be used as a type of high density on-die L4/LLC memory for a multi-core processor. However, concerns with a cost associated with this type of memory in terms of impacts on advanced complementary metal-oxide-semiconductor (CMOS) manufacturing process technologies may outweigh density benefits. Large silicon (Si) based dies that may approach or exceed 600 square millimeters (mm²) potentially have severely impacted process yields when including 1T-1C eDRAM as on-die L4/LLC memory. The severely impacted process yields may unacceptably add to a total system cost. Therefore, a need exists to have a type of memory for L4/LLC that has less of an impact on process costs and may also have simpler process steps that are closer to older types of CMOS manufacturing process technologies.

Figure 1:
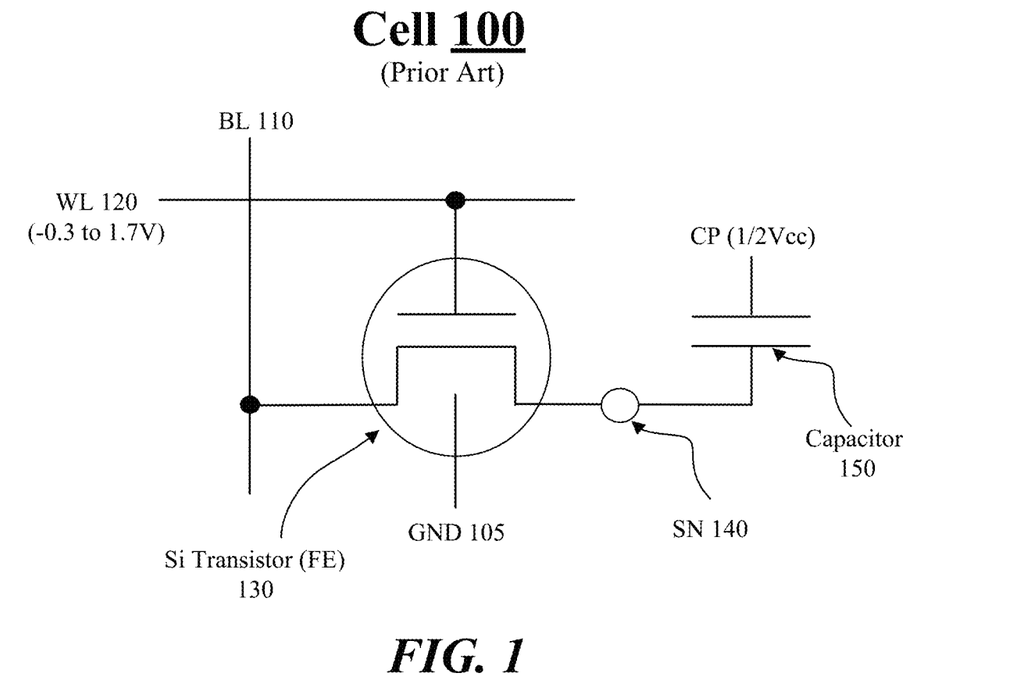
FIG. 1 illustrates an example first cell.

FIG. 1 illustrates an example cell 100. In some examples, as shown in FIG. 1, cell 100 includes a bit-line (BL) 110, a word-line (WL) 120, a Si transistor 130 and a capacitor 150. A storage node (SN) 140 may maintain a bit value (e.g., "0" or "1") for cell 100. For these examples, cell 100 may represent a 1T-1C eDRAM cell structure. Cell 100 may be similar to a commodity type DRAM. One difference between cell 100 and a commodity type DRAM may be different voltage for WL 120. A commodity type DRAM may have a range of −0.3 to 3.0V while cell 100, as shown in FIG. 1, has a range of −0.3 to 1.7V. Also, storage node 130 may maintain a "0" state when Si transistor 130's gate is held to ground while a commodity type DRAM pulls its respective transistor gate to around −0.3V. Another difference may be that commodity DRAM cells may have relatively taller cell capacitors for commodity type DRAM cells compared to cell capacitors for 1T-1C eDRAM cells such as cell 100. The relatively taller cell capacitors may add a significant amount of undesirable complexity to CMOS manufacturing process technologies for use as on-die L4/LLC memory for a processor.

Although 1T-1C eDRAM cell structures such as cell 100 may be more desirable for on-die L4/LLC memory compared to commodity DRAM, Si transistor 130 of cell 100 is created during a front-end (FE) Si process stack that may still add an undesirable amount of complexity to already complex CMOS manufacturing. In particular, cell capacitors such as capacitor 150 add complexity as they require a metal insulator metal capacitor over bit line (MIM COB). Si transistor 130 also adds complexity as it is also formed in various layers during the FE Si process stack.

Figure 2:
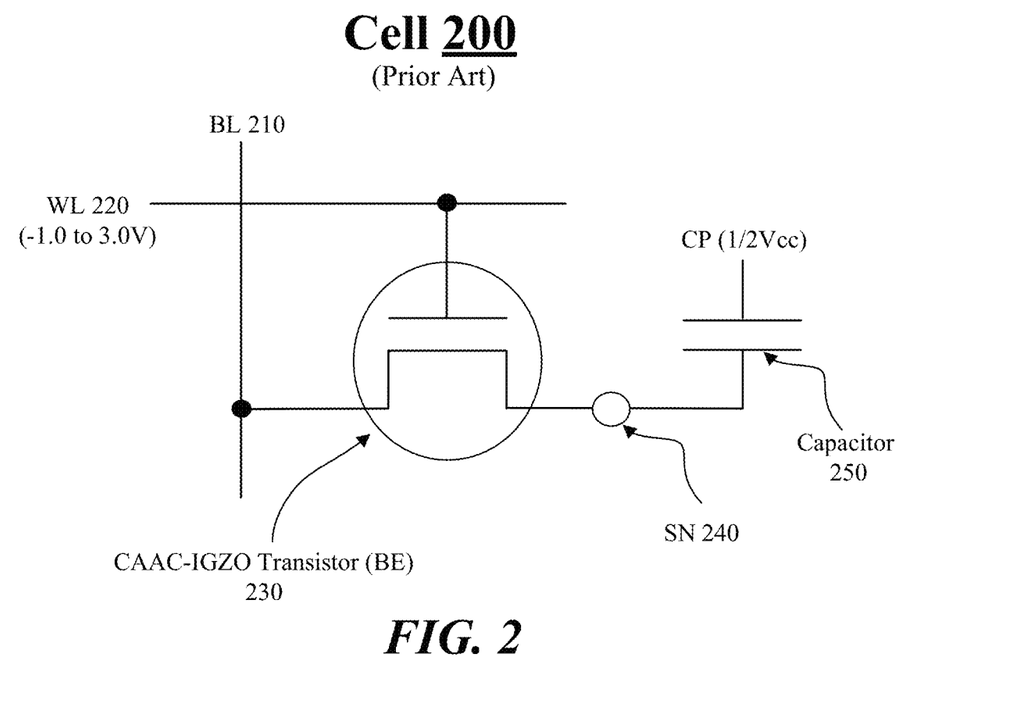
FIG. 2 illustrates an example second cell

FIG. 2 illustrates an example cell 200. In some examples, as shown in FIG. 2, cell 200 includes a BL 210, a WL 220, a c-axis-aligned crystalline indium-gallium-zinc-oxide (CAAC-IGZO) transistor 230 and a capacitor 250. An SN 240 may maintain a bit value at for cell 200. For these examples, cell 200 may represent a 1T-1C dynamic oxide semiconductor (DOS)-RAM cell that is basically a similar cell structure as for commodity DRAM and the 1T-1C eDRAM cell structures. But cell access transistor CAAC-IGZO transistor 230 for cell 200 is not created via an FE Si process stack as mentioned above for Si transistor 130. Rather, CAAC-IGZO transistor 230 may be a type of transistor formed at a back-end (BE) or backend-of-the-line (BEOL) part of a process stack sometimes referred to as a "BE metal process".

According to some examples, IGZO transistors like CAAC-IGZO transistor 230 may be formed over any desired surface (e.g., crystalline substrate is not needed for depositing IGZO), IGZO transistors may be integrated into any location on a die or chip. Additionally, low temperature processing (e.g., below approximately 400° C.) may be used to deposit IGZO. The combination of being formed on any substrate in addition to being formed with a relatively low temperature process allows CAAC-IGZO transistor 230 to be integrated into a BE metal process.

CAAC-IGZO transistor 230's ability to be integrated into a BE metal process may reduce complexity of using a cell 200 as a type of on-die L4/LLC memory for processor. However, cell 200 still includes a capacitor that may add process complexity. Also, as shown in FIG. 2, cell 200 requires input voltage of ½ Vcc to capacitor 250 to sense a state of SN 240 that may increase power usage. Also, as shown in FIG. 2, cell 200 has a single path for reading from or writing to SN 240.

Figure 3:
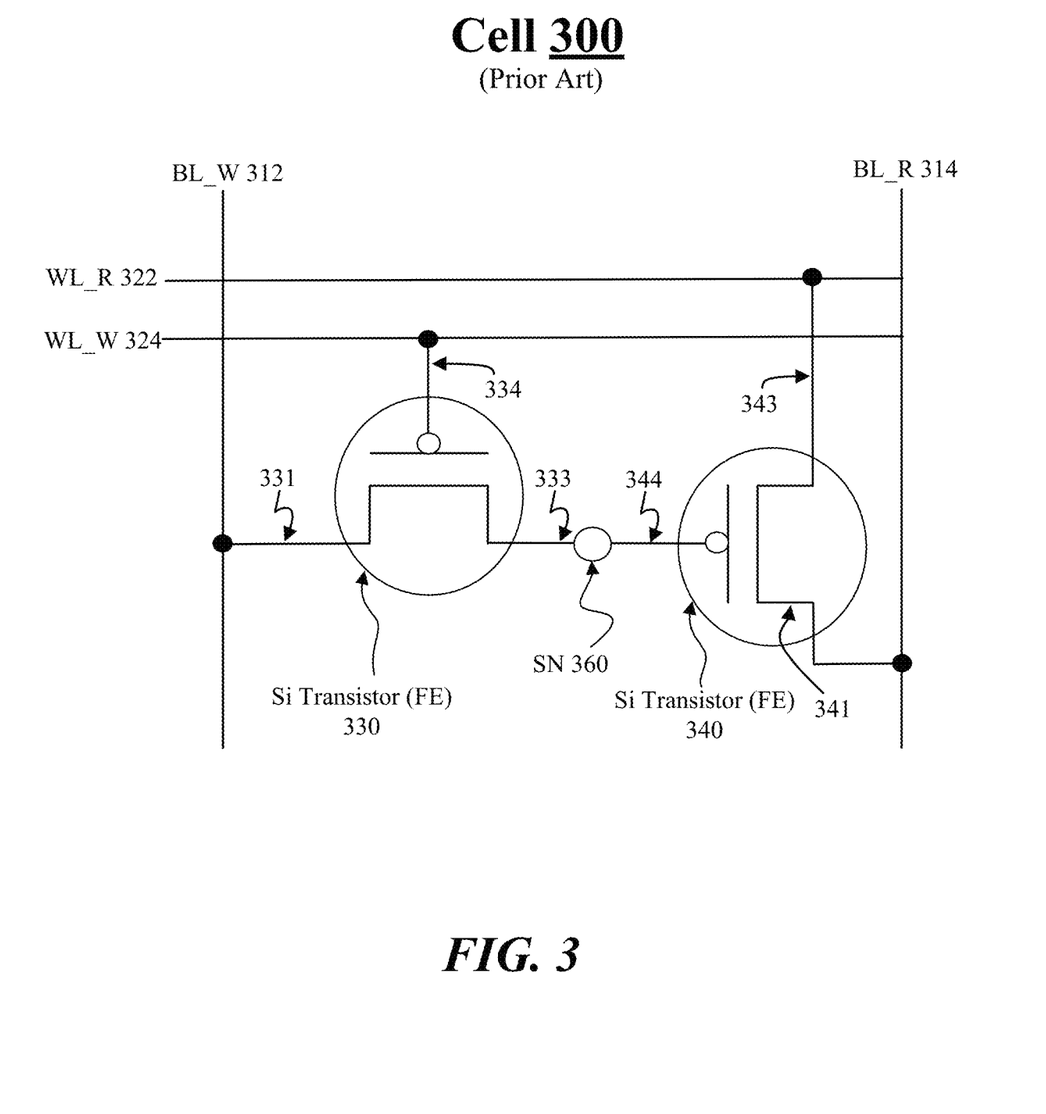
FIG. 3 illustrates example third cell.

FIG. 3 illustrates an example cell 300. In some examples, as shown in FIG. 3, cell 300 includes a BL write (BL_W) 312, a BL read (BL_R) 314, a WL read (WL_R) 322, WL write (WL_W) 324, Si transistors 330 and 340. An SN 360 may maintain a bit value for cell 300. For these examples, Si transistors 330 and 340 may be formed via a FE Si process stack and as shown in FIG. 3, may be p-channel metal-oxide-semiconductor (PMOS) type transistors. Cell 300 may be an example of a type of structure for a 2T gain cell memory. Si transistors 330 and 340 may be PMOS type transistors rather than n-channel MOS (NMOS) type transistors due to improved retention times for memory states maintained in SN 340 that may be a characteristic of Si type transistors. The improved retention times due to reduced gate and sub-threshold leakage currents for PMOS transistors formed via an FE Si process stack.

According to some examples, a 2T gain cell may have a density advantage over SRAM types of memory with potentially fast read and write paths to read or write data due to the separate read/write paths as shown in FIG. 3. For these examples, Si transistor 330 includes source/drain node 331 coupled to BL_W 312, gate node 334 coupled to SN 360. Also, Si transistor 340 includes gate node 344 coupled to SN 360, source/drain node 343 coupled to BL_R 314. In operation, when cell 300 is not selected to read or write it is considered to be in a hold state, in which WL_W 324 is high, WL_R 322 and BL_R 314 are low, and BL_W 312 can be either low or high. Both Si transistors 340 and 350 are turned off, and a stored voltage is preserved. SN 360 holds a voltage that determines whether cell 300 holds a "1" or "0". Data is written to cell 300 when Si transistor 330 is turned on and the state maintained in SN 360 is influenced by a voltage present on BL_W 312. Data is read from cell 300 when Si transistor 340 is turned on, and a voltage on BL_R 314 changes based in part on the state maintained in SN 360.

In some examples, although cell 300 includes a 2T gain cell capable of high density compared to SRAM, Si transistors 330 and 340 formed via a FE Si process may add an unacceptable level of process complexity to use this type of Si transistor memory cell as an L4/LLC for a large die that is also formed during the FE Si process. Additionally, these types of Si transistor memory cells may occupy costly real estate on a semiconducting layer of the large die that may further increase costs to use this type of Si transistor memory cell as an L4/LLC.

Figure 4:
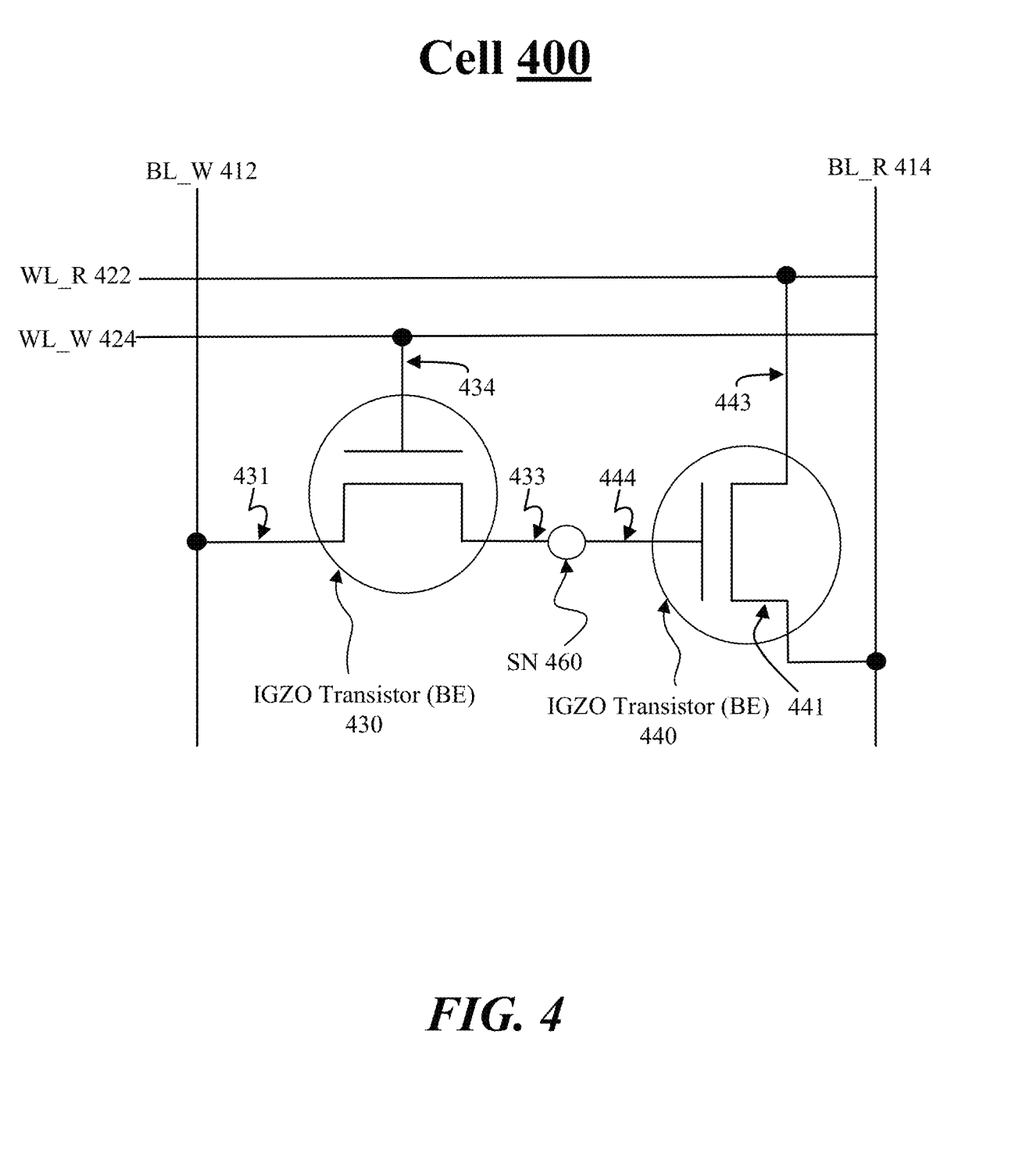
FIG. 4 illustrates an example fourth cell.

FIG. 4 illustrates an example cell 400. In some examples, as shown in FIG. 4, cell 400 is similar to cell 300. Similarities include both cells being a type of structure for a 2T gain cell memory that has separate read/write paths. A key difference between cell 400 and cell 300 is the inclusion of IGZO transistors that are formed at a BE or BEOL part of a process stack similar to the transistors mentioned above for cell 200 and include each transistor formed in a separate layer of the BE process stack (described more below). For these examples, as shown in FIG. 4, cell 400 includes BL_W 412, a BL_R 414, a WL_R 422, WL_W 424, and IGZO transistors 430 and 440. An SN 460 may maintain a bit value for cell 400. For these examples, IGZO transistors 430 and 440 may be NMOS type transistors due to material characteristics of low leakage for IGZO materials that allows for use of NMOS type transistors that are smaller and have higher operating rates compared to PMOS type transistors. Smaller size improves memory cell densities and higher operating rates are important for the use of IGZO transistors 430 and 440 as part of an L4/LLC memory for a processor.

In some examples, the schematic diagram of a 2T gain cell shown in FIG. 1 includes NMOS type transistors. As shown, cell 400 includes a first NMOS type IGZO transistor 430 having a first controlled node 431, a second controlled node 433, and a gate 434. Since MOS transistors are symmetrical, the designation of a source or drain terminal is somewhat arbitrary as determined by the voltage applied to a transistor. Accordingly, the term "controlled node", as used herein, may refer to either a source or drain terminal within an NMOS transistor. Cell 400 further includes a second NMOS type IGZO transistor 140 having a first controlled node 441, a second controlled node 443, and a gate 444. As shown, the gate 444 of NMOS type IGZO transistor 440 may be coupled to the second controlled node 443 of IGZO transistor 430 defining a charge storage node 460 therebetween. The charge storage node 460 may have a capacitance equal to the sum of the parasitic capacitance of the second controlled node 433 of IGZO transistor 430 and the parasitic capacitance of the gate 444 of IGZO transistor 440.

According to some examples, in operation, when cell 400 is not selected to read or write it is considered to be in a hold state, in which WL_W 424 is high, WL_R 422 and BL_R 414 are low, and BL_W 412 can be either low or high. Both IGZO transistors 430 and 440 are turned off, and a stored voltage is preserved. SN 460 holds a voltage that determines whether cell 400 holds a "1" or "0". Data is written to cell 400 when IGZO transistor 430 is turned on and the state maintained in SN 460 is influenced by a voltage present on BL_W 412. Data is read from cell 400 when IGZO transistor 440 is turned on, and a voltage on BL_R 414 changes based in part on the state maintained in SN 460.

Figure 5:
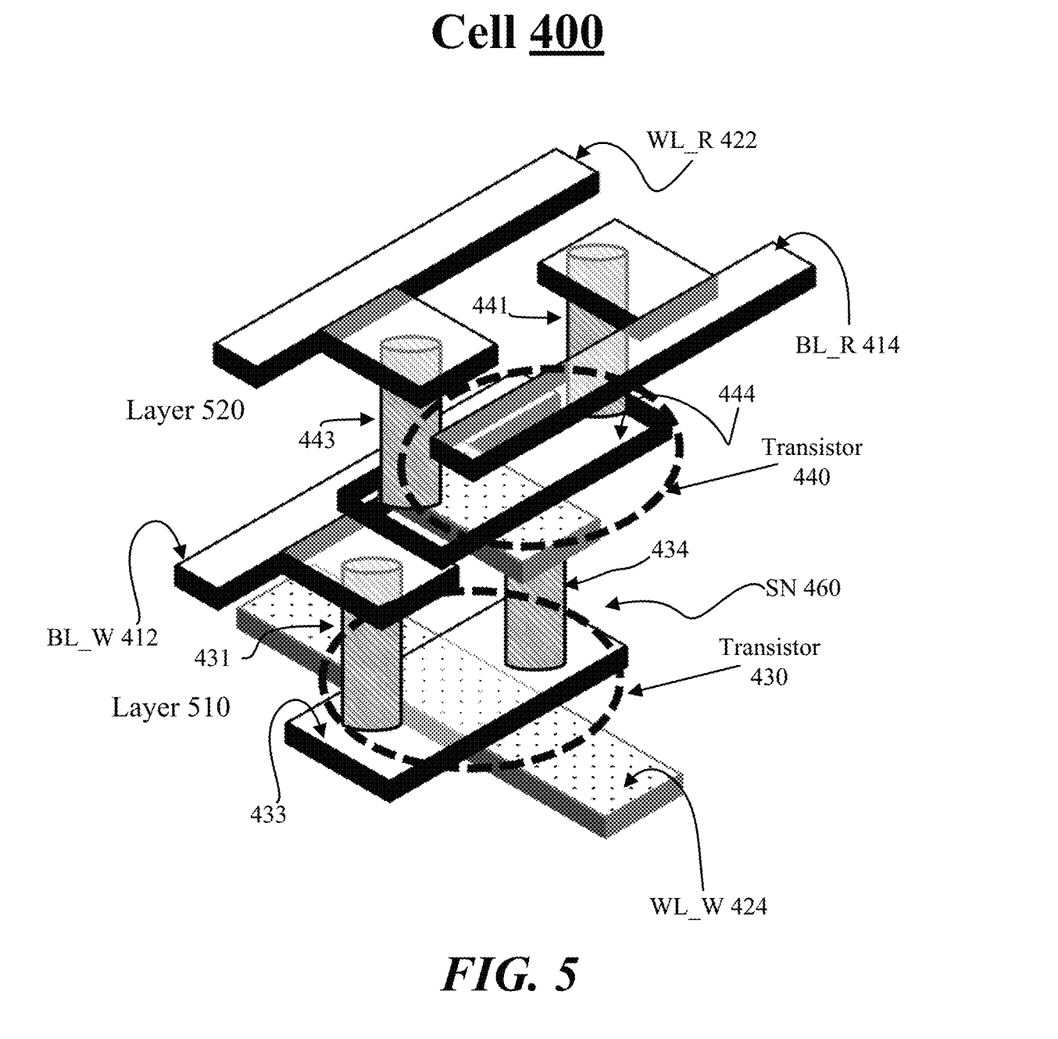
FIG. 5 illustrates an example 3-dimensional view of the example fourth cell.

FIG. 5 illustrates an example 3-dimensional (3D) view of cell 400. In some examples, as shown in FIG. 5, the 3D view of cell 400 depicts a first layer 510 and a second layer 520. For these examples, IGZO transistor 430 is included in the layer 510 and IGZO transistor 440 is included in layer 520. The stacking of transistors for cell 400 in separate layers allows for a higher density of memory cells on a given die. Also, as described more below, a less complex BE or BEOL metal process may be used to manufacturer each level that includes IGZO transistors 430 or 440.

Figure 6:
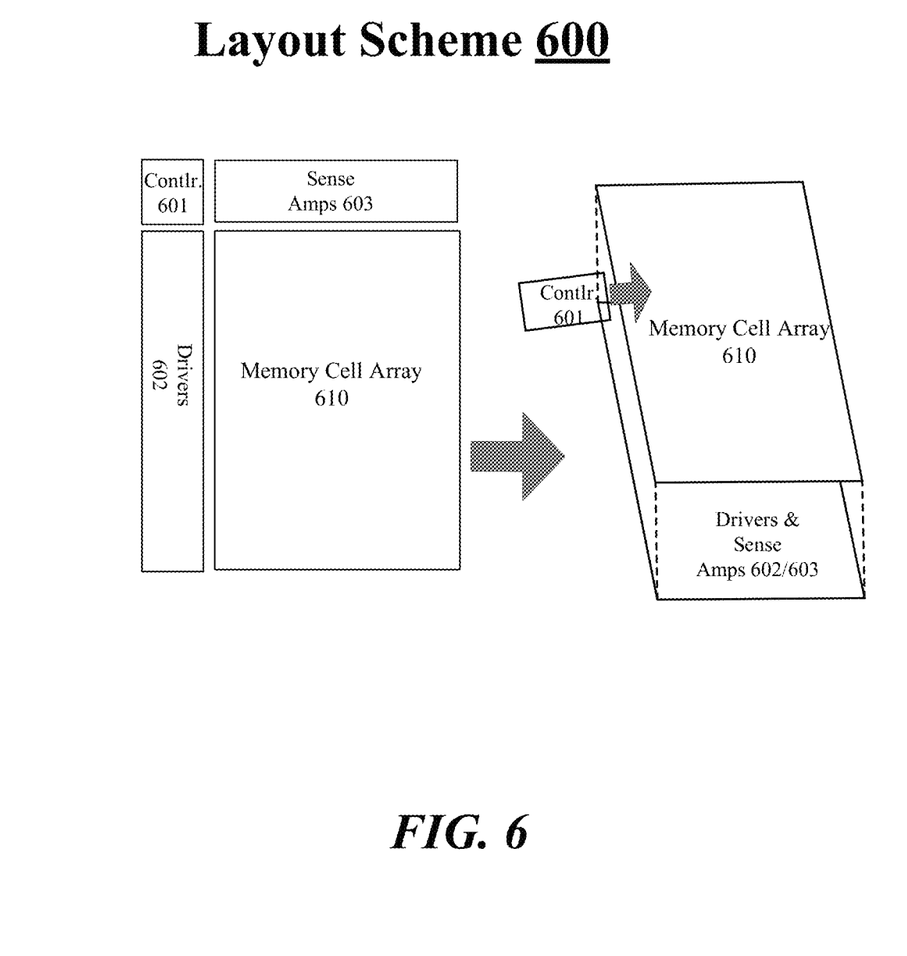
FIG. 6 illustrates an example layout scheme.

FIG. 6 illustrates an example layout scheme 600. In some examples, layout scheme 600 shows how, thanks to the generation of cells like cell 400 via a BE metal process, a memory array 610 may have associated controller 601, drivers 602 and sense amps 603 located under memory array 610. For these examples, a die surface area available following an Si FE process stack to build processor circuitry may be utilized to squeeze or shrink a die layout area compared to using on an Si FE process stack to build a memory cell array to serve as an L4/LLC for the processor.

Examples of this disclosure includes a process flow that may be used to form a multi-layer IGZO transistor included in a memory cell (e.g., memory cell 400). An example process flow is illustrated and described below with respect to FIGS. 7A-L.

Figure 7A:
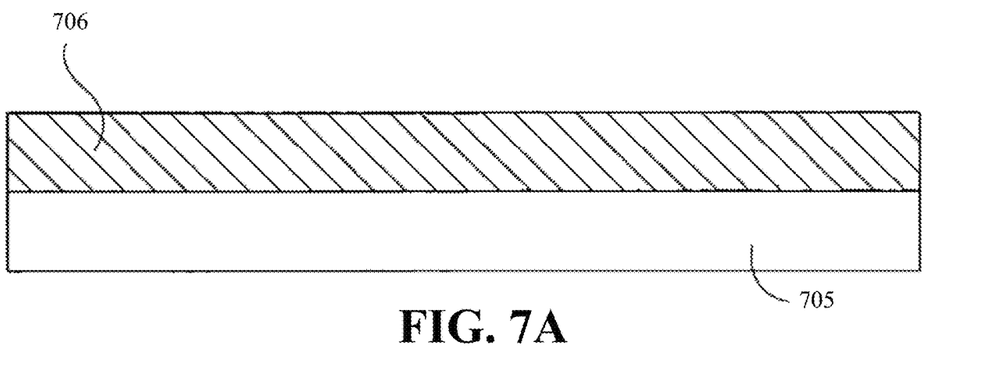
FIGS. 7A-L illustrate an example process to build an IGZO transistor.

Referring now to FIG. 7A, a cross-sectional illustration of a substrate 705 with a dielectric layer 706 formed over the surface is shown. Implementations of the invention may be formed or carried out on a substrate, such as a semiconductor substrate. Due to the low temperature processing operations described in greater detail below, examples may include using any substrate material. In one example, the substrate 705 may be an interlayer dielectric (ILD) in a BEOL or BE metal process stack. For example, ILD substrates may be formed using dielectric materials known for their applicability in integrated circuit structures, such as low-k dielectric materials. Examples of dielectric materials that may be used for the substrate 705 include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant. In one implementation, the substrate 705 may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate 705 may be formed are described here, any material that may serve as a foundation upon which a semiconductor device may be built falls within the spirit and scope of the present invention.

According to some examples, the dielectric layer 706 may be the same material as the substrate 705. Additional embodiments may include using a dielectric layer that is a different material than the substrate 705. In some examples, an etchstop layer (not shown) may be formed between the substrate 705 and the dielectric layer 706. Including an etchstop layer between the substrate 705 and the dielectric layer 706 may provide improved control to etching process used in subsequent processing operations.

Figure 7B:
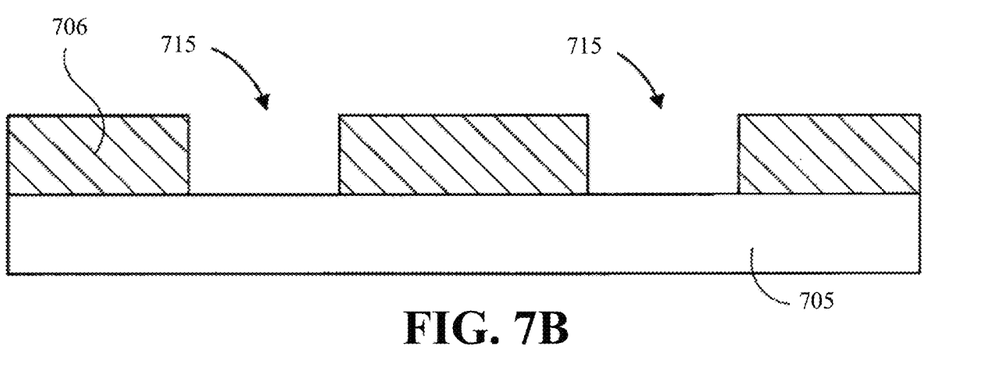

Referring now to FIG. 7B, a cross-sectional illustration of the dielectric layer 706 after source and drain openings 715 are patterned is shown. In some examples, the dielectric layer 706 may be patterned with a photolithographic process known in the art.

Figure 7C:
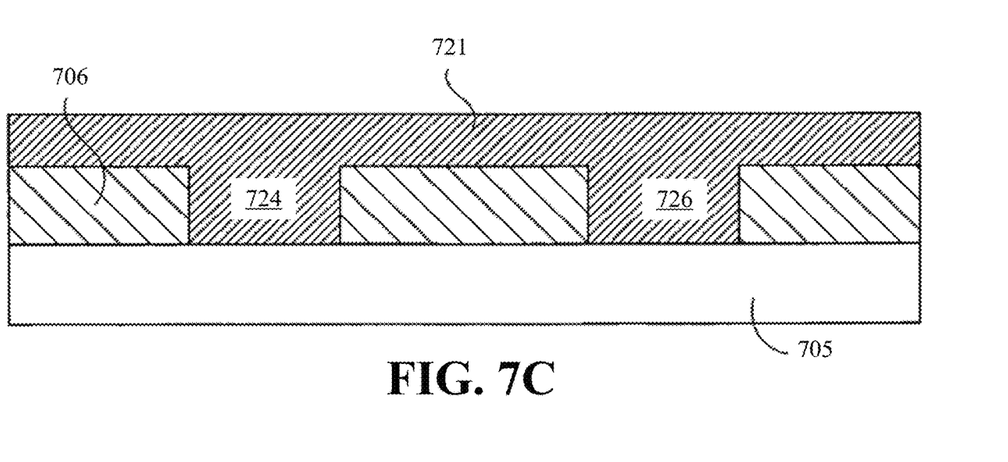

Referring now to FIG. 7C, a cross-sectional illustration of the dielectric layer 706 after a conductive material 721 is deposited over the surface is shown. As illustrated, the deposited conductive material 721 may fill the source and drain openings 715 to form a source region 724 and a drain region 726. Additionally, the metal deposition process may deposit conductive material 721 over a top surface of the dielectric layer 706. According to an embodiment of the invention, the conductive material 721 may be deposited with any suitable process, such as electroless plating or the like. According to some examples, the conductive material may be any conductive material, such as a metallic material. In examples where the substrate 705 is a layer in a BEOL or BE metal process stack, the conductive material 721 may be the same conductive material used to form interconnect lines and vias (not shown) in the BEOL or BE metal process stack. By way of example, the conductive material may be copper.

Figure 7D:
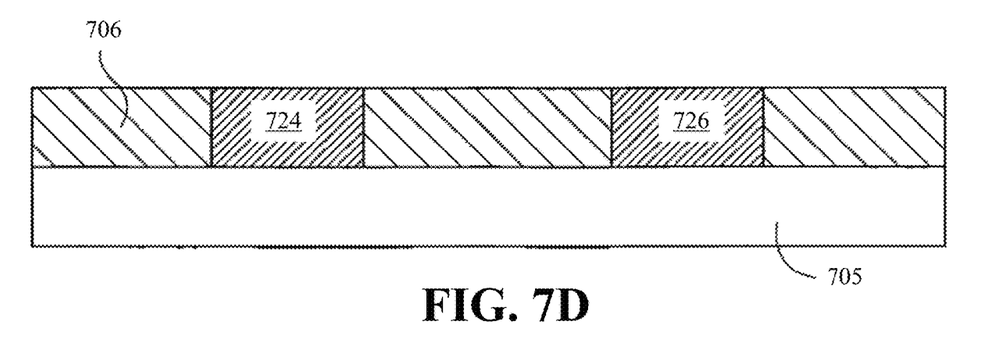

Referring now to FIG. 7D, a cross-sectional illustration of the dielectric layer 706 and the source and drain regions 724/726 after the excess conductive material 721 has been removed is shown. Removing the excess conductive material 721 from over the surface of the dielectric layer 706 electrically isolates the source region 724 from the drain region 726. According to an embodiment, the excess conductive material 721 may be removed with any suitable recessing process. For example, the excess conductive material 721 may be removed with an etching process or a chemical mechanical polishing (CMP) process.

Figure 7E:
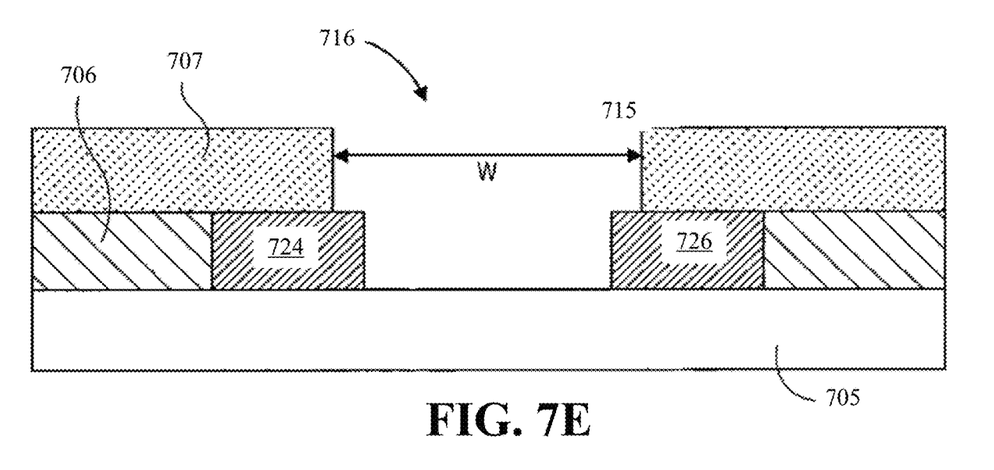

Referring now to FIG. 7E, a cross-sectional illustration of the device after a hardmask layer 707 is formed and patterned to form an opening 716 is shown. As illustrated, the opening 716 in the hardmask 707 is substantially centered over the portion of the dielectric layer 706 formed between the source region 724 and the drain region 726. The opening 716 may have a width W that is greater than the width of the spacing between the source region 724 and the drain region 726. Having an opening with a width W greater than the spacing between the source region 724 and the drain region 726 allows for a degree of misalignment. However, it is noted that the width W of the opening should not be greater than the distance between the outer edges of the source region 724 and the drain region 726, or else unwanted portions of the dielectric layer 706 may be exposed.

Figure 7F:
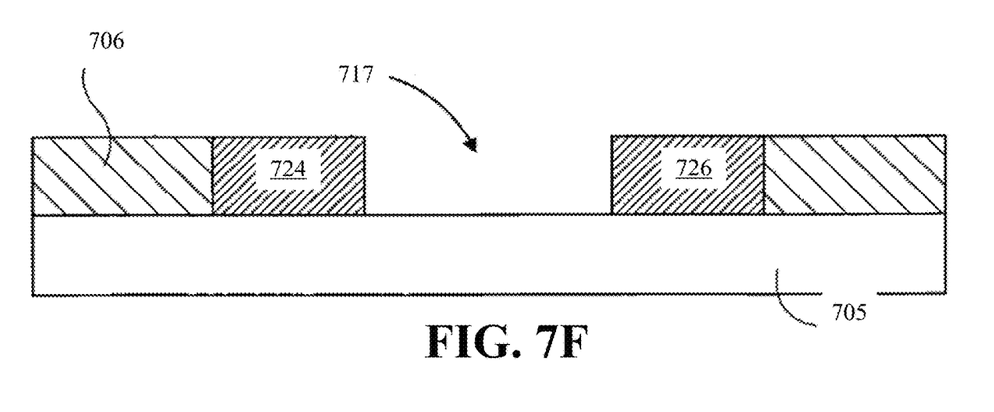

Referring now to FIG. 7F, a cross-sectional illustration of the dielectric layer 706 after the opening 716 in the hardmask layer 707 is transferred into the dielectric layer 706 to form a channel opening 717 is shown. In some examples, the dielectric material may be removed with an etching process. In one example process, the etching process may be a timed etch. Alternative example processes may utilize an etchstop layer between the dielectric layer 706 and the substrate 705 to provide better control of the etching process. In such an example process, a first etching process may remove the dielectric layer 706 and a second etching process may remove the etchstop layer. In one example, the etchstop layer may also be left and subsequent structures formed in the channel opening 717 may be formed over the etchstop layer.

Figure 7G:
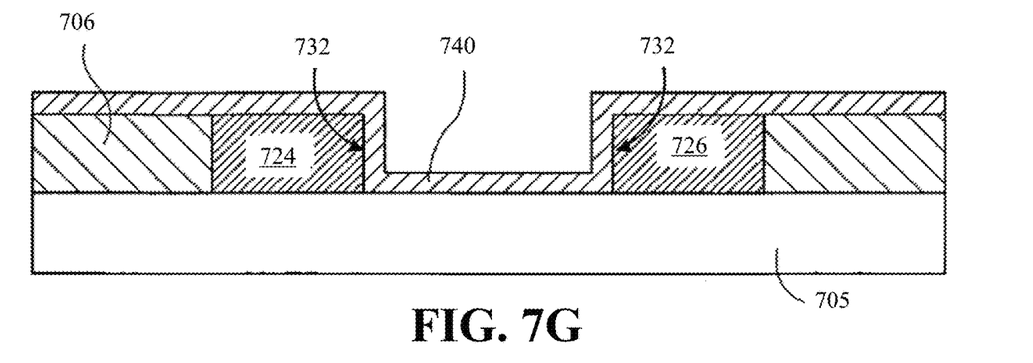

Referring now to FIG. 7G, a cross-sectional illustration of the device after an a-IGZO layer 740 is formed over the exposed surfaces is shown. In some examples, the a-IGZO layer 740 is a conformal layer that deposits along the sidewalls of the source region 724 and drain region 726 in addition to being formed along a bottom surface of the channel opening and over top surfaces of the dielectric layer 706, the source region 724, and the drain region 726. Accordingly, within the channel opening 717, the a-IGZO layer 740 may include sidewall portions formed in contact with the sidewalls of the source region 724 and the drain region 726, and a planar portion that is substantially parallel to a surface of the substrate 705. In an embodiment, the a-IGZO layer 740 may be deposited with a low temperature process. For example, the a-IGZO layer 740 may be deposited with a process that does not exceed approximately 400° C. In an example process, the a-IGZO layer 740 may be deposited with a physical vapor (PVD) deposition process (e.g., sputtering), a chemical vapor deposition (CVD) process, or atomic layer deposition (ALD).

Figure 7H:
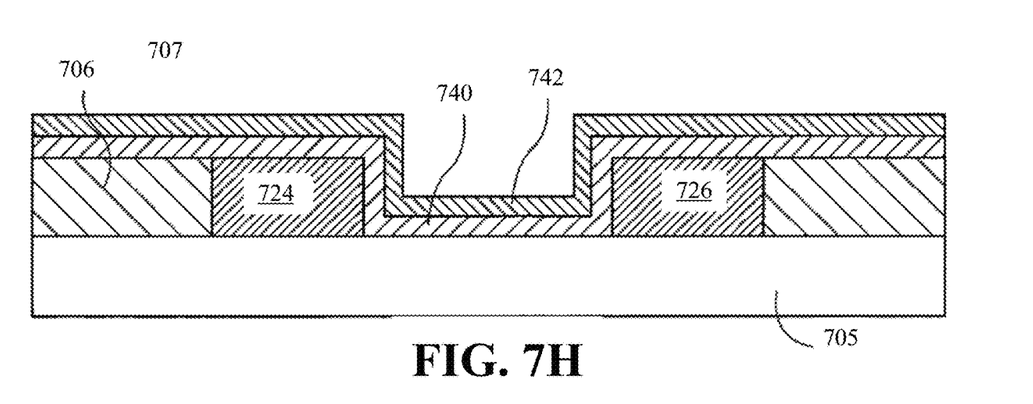

Referring now to FIG. 7H, a cross-sectional illustration of the device after a gate dielectric layer 742 is deposited over the a-IGZO layer 740 is shown. According to some examples, the gate dielectric layer 742 may contact more than one surface of the a-IGZO layer 740. For example, the gate dielectric layer 742 may contact sidewall surfaces of the IGZO layer 740 formed along the source and drain regions, and a planar surface of the a-IGZO 740 formed over the substrate 705. The gate dielectric layer 742 may include one layer or a stack of layers. The one or more layers may include silicon oxide, SiO2 and/or a high-k dielectric material. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

Figure 7I:
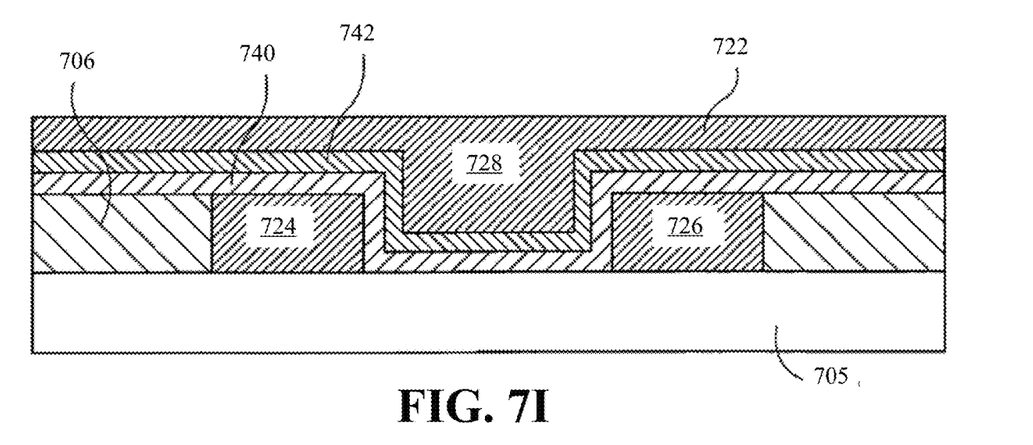

Referring now to FIG. 7I, a cross-sectional illustration of the device after a second conductive material 722 is deposited over the gate dielectric layer 742 is shown. As illustrated, the second conductive material 722 may fill the trench above the gate dielectric layer 742 and extend over a top surface of the device. The portion of the conductive material 722 that is formed in the channel opening is the gate electrode 728. The conductive material 722 used to form the gate electrode 728 may consist of at least one P-type work function metal or N-type work function metal, depending on whether the transistor is to be a PMOS or an NMOS transistor. In some examples, the gate electrode 728 may consist of a stack of two or more metal layers, where one or more metal layers are work function metal layers and at least one metal layer is a fill metal layer. Examples of this process include a low temperature deposition process. For example, the conductive material 722 may be deposited with a PVD process, such as sputtering.

For a PMOS transistor, metals that may be used for the gate electrode 728 include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode 728 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

Figure 7J:
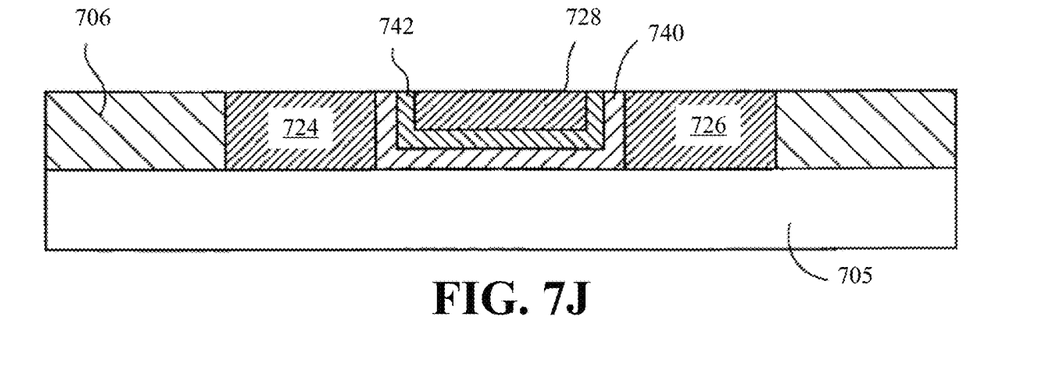

Referring now to FIG. 7J, a cross-sectional illustration of the device after the excess metal 722 is removed is shown. Removing the excess conductive material 722 from over the surface of the dielectric layer 706 electrically isolates the gate electrode 728. Furthermore, it is to be appreciated that the processing operations used allow for the formation of a self-aligned gate electrode 728. Accordingly, no patterning processes are needed to form a gate electrode that is aligned above the channel. Additionally, the portions of the gate dielectric 742 and the a-IGZO layer 740 formed over the top surfaces of the dielectric layer 706, the source region 724, and the drain region 726 may be removed. According to some examples, the excess conductive material 722, the excess gate dielectric 742, and the excess a-IGZO 740 may be removed with any suitable recessing process. For example, the recessing process may include one or more etching processes and/or a chemical mechanical polishing (CMP) process.

Figure 7K:
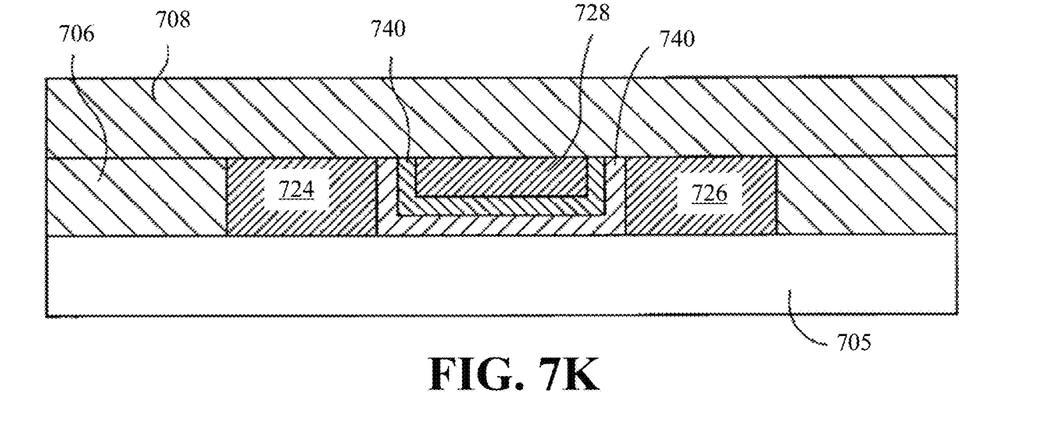

Referring now to FIG. 7K, a cross-sectional illustration of the device after a second dielectric layer 708 is formed over the device is shown. In some examples, the second dielectric layer 708 may be the same material as the first dielectric layer 706. In examples where the transistor device is formed in a BEOL or BE metal process stack, the second dielectric layer 708 may be the next layer in the stack. Additional examples include forming a second dielectric layer 708 that is a different material than the first dielectric layer 706.

Figure 7L:
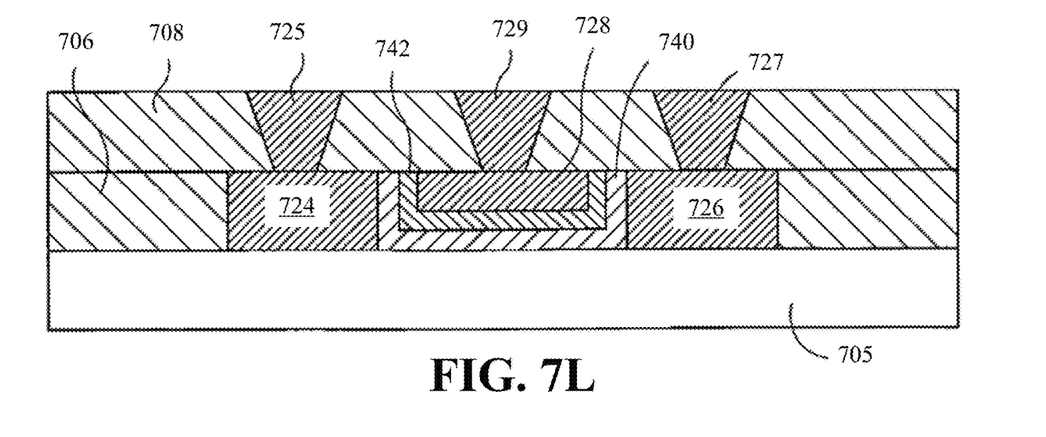

Referring now to FIG. 7L, a cross-sectional illustration of the device after contacts are formed to the source, drain, and gate is shown. As illustrated, a gate contact 729 contacts the gate electrode 728, the source contact 725 contacts the source region 724, and the drain contact 727 contacts the drain region 726. According to an embodiment, the contacts may be formed with a patterning and metal deposition process, as is known in the art. In an example, the contacts 725, 727, 729 may be formed at the same time interconnects or vias (not shown) are formed in a BEOL or BE metal process stack.

The transistor illustrated in FIG. 7L may be considered a non-planar transistor because the a-IGZO channel 740 extends in both the lateral and vertical directions. The a-IGZO channel 740 extends in the lateral direction along the surface of the substrate 705 and in the vertical direction along the sidewalls of the source region 724 and the drain region 726. Accordingly, embodiments of the invention include a gate electrode that controls the channel along more than one surface.

Figure 8:
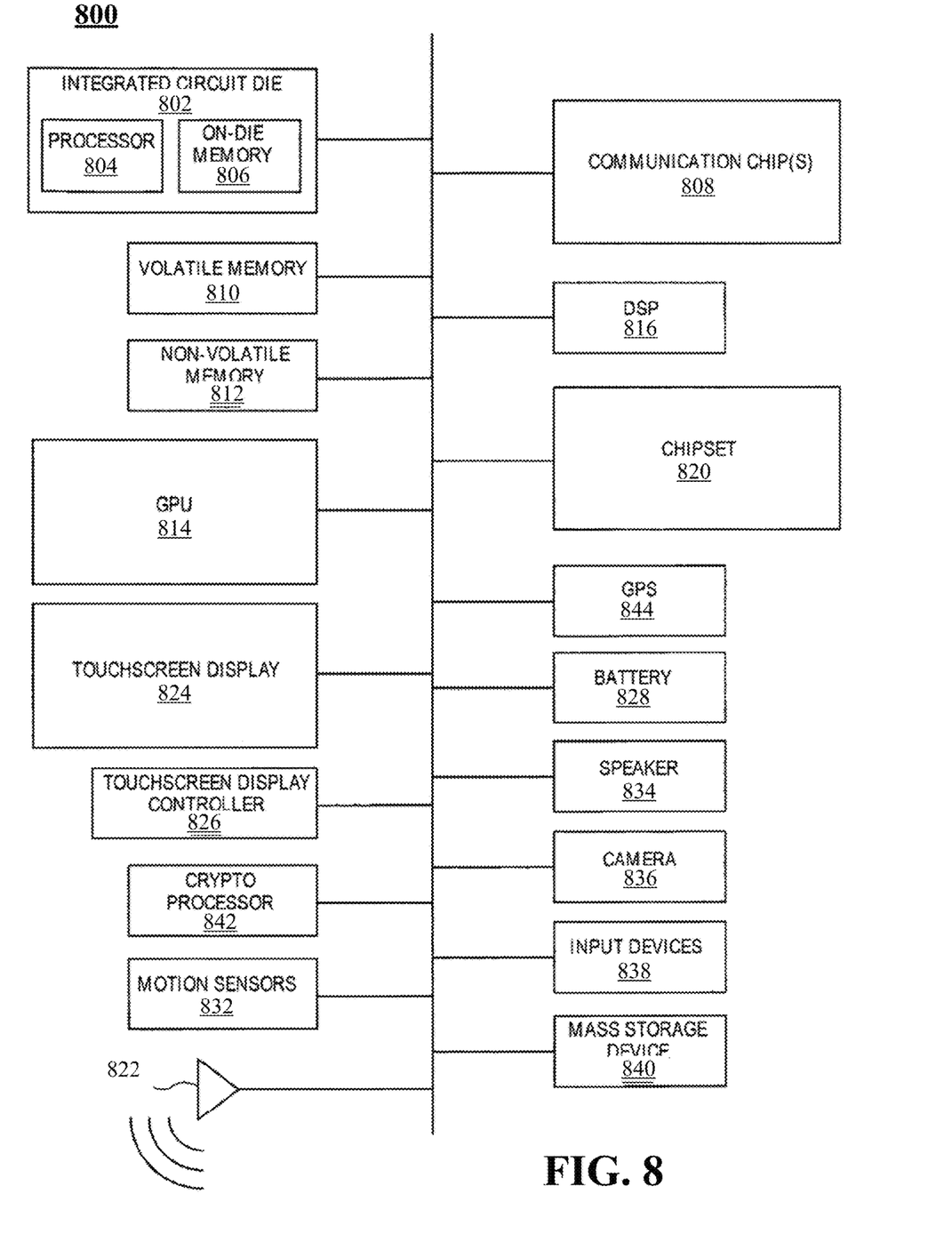
FIG. 8 illustrates an example computing device.

FIG. 8 illustrates a computing device 800. In some examples, computing device 800 may include a number of components. These components may be attached to one or more motherboards. In an alternate examples, these components may be fabricated onto a single system-on-a-chip (SoC) die rather than a motherboard. The components in the computing device 800 include, but are not limited to, an integrated circuit die 802 and at least one communication chip 808. In some implementations the communication chip 808 is fabricated as part of the integrated circuit die 802. The integrated circuit die 802 may include a CPU 804 as well as on-die memory 806, often used as cache memory, that includes a memory array having cells separately including two non-planar a-IGZO transistors (e.g., cell 400).

Computing device 800 may include other components that may or may not be physically and electrically coupled to the motherboard or fabricated within an SoC die. These other components include, but are not limited to, volatile memory 810 (e.g., DRAM), non-volatile memory 812 (e.g., ROM or flash memory), a graphics processing unit 814 (GPU), a digital signal processor 816, a crypto processor 842 (a specialized processor that executes cryptographic algorithms within hardware), a chipset 820, an antenna 822, a display or a touchscreen display 824, a touchscreen controller 826, a battery 828 or other power source, a power amplifier (not shown), a global positioning system (GPS) device 844, a compass 830, a motion coprocessor or sensors 832 (that may include an accelerometer, a gyroscope, and a compass), a speaker 834, a camera 836, user input devices 838 (such as a keyboard, mouse, stylus, and touchpad), and a mass storage device 840 (such as hard disk drive, compact disk (CD), digital versatile disk (DVD), and so forth).

The communications chip 808 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 808 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 808. For instance, a first communication chip 808 may be dedicated to shorter range wireless communications such as Wi-Fi and Bluetooth and a second communication chip 808 may be dedicated to longer range wireless communications such as GPS, EDGE, GPRS, CDMA, WiMAX, LTE, Ev-DO, and others.

In various embodiments, the computing device 800 may be a laptop computer, a netbook computer, a notebook computer, an ultrabook computer, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further examples, the computing device 800 may be any other electronic device that processes data.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled" or "coupled with", however, may also mean that two or more elements are not in direct contact with each other, but yet still co-operate or interact with each other.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus, the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A two-transistor dynamic random access memory (DRAM) cell comprising:
a read bit line;
a write bit line;
a read word line;
a write word line;
a first indium-gallium-zinc-oxide (IGZO) transistor with a first gate region coupled to the write word line, a first controlled node region coupled to the write bit line, and a second controlled node region; and
a second IGZO transistor with a second gate region, a third controlled node region coupled to the read word line, and a fourth controlled node region coupled to the read bit line, the second gate region of the second IGZO transistor coupled to the second controlled node region of the first IGZO transistor,
wherein the first IGZO transistor is included in a first layer created in a back end (BE) metal process stack of an integrated circuit chip and the second IGZO transistor is included in a second layer created in the BE metal process stack.

2. The two-transistor DRAM cell of claim 1, the first and second IGZO transistors comprising n-channel metal-oxide-semiconductor (NMOS) type transistors.

3. The two-transistor DRAM cell of claim 1, comprising the integrated circuit chip to include a processor, the two-transistor DRAM cell included in a memory array arranged to be an on-die last-level cache for the processor.

4. The two-transistor DRAM cell of claim 3, the memory array created in the BE metal process stack and the processor created in a front end silicone process stack of the integrated circuit chip.

5. A system comprising:
an integrated circuit chip; and
a two-transistor dynamic random access memory (DRAM) cell that includes:
a first indium-gallium-zinc-oxide (IGZO) transistor with a first gate region coupled to a write word line, a first controlled node region coupled to a write bit line, and a second controlled node region; and
a second IGZO transistor with a second gate region, a third controlled node region coupled to a read word line, and a fourth controlled node region coupled to a read bit line, the second gate region of the second IGZO transistor coupled to the second controlled node region of the first IGZO transistor,
wherein the first IGZO transistor is included in a first layer created in a back end (BE) metal process stack of the integrated circuit chip and the second IGZO transistor is included in a second layer created in the BE metal process stack.

6. The system of claim 5, the first and second IGZO transistors comprising n-channel metal-oxide-semiconductor (NMOS) type transistors.

7. The system of claim 5, comprising the integrated circuit chip to include a processor, the two-transistor DRAM cell included in a memory array arranged to be an on-die last-level cache for the processor.

8. The system of claim 7, the memory array created in the BE metal process stack and the processor created in a front end silicone process stack of the integrated circuit chip.

* * * * *